(12) United States Patent
Doan

(10) Patent No.: US 6,793,764 B1
(45) Date of Patent: Sep. 21, 2004

(54) CHEMICAL DISPENSING SYSTEM FOR SEMICONDUCTOR WAFER PROCESSING

(75) Inventor: Trung T. Doan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 535 days.

(21) Appl. No.: 09/652,969

(22) Filed: Aug. 31, 2000

Related U.S. Application Data

(62) Division of application No. 09/133,989, filed on Aug. 14, 1998, which is a continuation of application No. 08/944,135, filed on Oct. 6, 1997, now Pat. No. 5,952,050, which is a continuation of application No. 08/618,072, filed on Feb. 27, 1996, now abandoned.

(51) Int. Cl.[7] .............................................. B05C 11/02
(52) U.S. Cl. ................................. 156/345.17; 118/730
(58) Field of Search ........................... 156/345, 345.17; 118/715, 730

(56) References Cited

U.S. PATENT DOCUMENTS

| 3,834,083 A | 9/1974 | Hoshi et al. .................... 51/57 |
| 3,900,866 A | 8/1975 | Bell et al. ....................... 346/1 |
| 4,113,492 A | 9/1978 | Sato et al. ...................... 96/67 |
| 4,314,022 A | 2/1982 | Fisch ......................... 430/326 |

(List continued on next page.)

FOREIGN PATENT DOCUMENTS

| JP | 56-73579 | 6/1981 | ............ B05D/7/04 |
| JP | 2-157763 | 6/1990 | ......... H01L/21/027 |
| JP | 5-175117 | 7/1993 | ......... H01L/21/027 |
| JP | 8-5825 | 1/1996 | ............ G02B/5/20 |

Primary Examiner—Gregory Mills
Assistant Examiner—Sylvia R. MacArthur
(74) Attorney, Agent, or Firm—Charles Brantley

(57) ABSTRACT

A method for dispensing a chemical, such as an edge bead removal solvent, onto a semiconductor wafer comprising the steps of dispensing the chemical selectively onto the wafer and applying a suction to the area immediately surrounding the location at which the chemical is dispensed onto the wafer. Preferably, the suction is applied substantially simultaneously with the dispensing of the chemical. One specific version of the invention provides an edge bead removal system wherein suction is applied to the area immediately surrounding the solvent dispensing nozzle to remove dissolved coating material and excess solvent from the wafer. In one aspect of this system, an apparatus for removing the edge bead includes a mechanism for dispensing a solvent selectively onto the edge of the wafer, and a mechanism surrounding the dispensing mechanism for vacuuming excess solvent and dissolved coating material from the edge of the wafer. The edge bead removal apparatus preferably also includes mechanisms for spinning the semiconductor wafer and coating material on the spinning wafer. Another aspect of the system provides a method for removing an edge bead of a coating of material that has been spun onto the surface of a semiconductor wafer. The method includes the steps of dispensing a solvent selectively onto the edge of the wafer to dissolve the coating material at the extreme edge of the wafer, and applying a suction to vacuum excess solvent and dissolved coating material from the wafer.

3 Claims, 2 Drawing Sheets

U.S. PATENT DOCUMENTS

| | | | |
|---|---|---|---|
| 4,393,807 A | 7/1983 | Fujimura et al. | 118/501 |
| 4,510,176 A | 4/1985 | Cuthbert et al. | 427/82 |
| 4,518,678 A | 5/1985 | Allen | 430/311 |
| 4,557,785 A | 12/1985 | Ohkuma | 156/345 |
| 4,576,796 A | 3/1986 | McCormick | 422/99 |
| 4,611,553 A | 9/1986 | Iwata et al. | 118/50 |
| 4,668,334 A | 5/1987 | Doornveld | 156/640 |
| 4,685,975 A | 8/1987 | Kottman et al. | 134/33 |
| 4,732,785 A | 3/1988 | Brewer | 427/240 |
| 4,790,262 A | 12/1988 | Nakayama et al. | 118/52 |
| 4,838,979 A | 6/1989 | Nishida et al. | 156/345 |
| 4,886,728 A | 12/1989 | Salamy et al. | 430/331 |
| 4,899,685 A | 2/1990 | Kawakami | 118/50 |
| 5,013,586 A | 5/1991 | Cavazza | 427/240 |
| 5,103,102 A | 4/1992 | Economou et al. | 250/492.2 |
| 5,151,219 A | 9/1992 | Salamy et al. | 252/364 |
| 5,178,989 A | 1/1993 | Heller et al. | 430/323 |
| 5,238,713 A | 8/1993 | Sago et al. | 427/240 |
| 5,279,926 A | 1/1994 | Chandler et al. | 430/311 |
| 5,289,222 A | 2/1994 | Hurtig | 354/317 |
| 5,294,257 A | 3/1994 | Kelly et al. | 118/52 |
| 5,358,740 A | 10/1994 | Bornside et al. | 427/240 |
| 5,362,608 A | 11/1994 | Flaim et al. | 430/327 |
| 5,378,511 A | 1/1995 | Cardinali et al. | 427/600 |
| 5,444,921 A | 8/1995 | Milina | 33/833 |
| 5,474,807 A | 12/1995 | Koshiishi | 427/240 |
| 5,580,607 A | 12/1996 | Takekuma et al. | 427/240 |
| 5,608,943 A | 3/1997 | Konishi et al. | 15/302 |
| 5,705,223 A | 1/1998 | Bunkofske | 427/240 |
| 5,759,427 A | 6/1998 | Cibulsky et al. | 216/91 |
| 5,952,050 A | 9/1999 | Doan | 427/336 |

CHEMICAL DISPENSING SYSTEM FOR SEMICONDUCTOR WAFER PROCESSING

RELATED APPLICATIONS

This application is a divisional of pending U.S. application Ser. No. 09/133,989, filed Aug. 14, 1998; which is a continuation of U.S. application Ser. No. 08/944,135, filed on Oct. 6, 1997 and issued as U.S. Pat. No. 5,952,050; which is a continuation of U.S. application Ser. No. 08/618,072, filed Feb. 27, 1996 and now abandoned.

FIELD OF THE INVENTION

The invention relates generally to the manufacture of semiconductor devices. More particularly, the invention relates to a chemical dispensing system for semiconductor wafer processes such as removing the edge bead formed during spin coating processes.

BACKGROUND OF THE INVENTION

Coating materials such as photoresist are typically applied to a semiconductor wafer by flowing liquid coating material onto the top surface of the wafer while it is spinning. The wafer is held on a disk shaped, rotating spin chuck. The diameter of the chuck is slightly less than the diameter of the wafer. The chuck is positioned so that the wafer lies on the chuck in a level horizontal plane. In operation, the backside or inactive surface of the wafer is placed onto the chuck. The chuck applies a suction to the backside of the wafer to hold the wafer in place on the chuck. The chuck is rotated by a motor driven axle that extends down from the chuck. As the wafer is rotated on the chuck, liquid photoresist material is applied to the center of the wafer. The photoresist spreads radially outward from the center of the wafer towards the edge to coat the top of the wafer. Ideally, all excess coating material is ejected from the edge of the wafer. In practice, however, some excess photoresist tends to collect at and form a bead along the edge of the wafer.

A solvent is dispensed along the edge of the wafer to dissolve the edge bead and remove the resist from the extreme edge of the wafer. The solvent may be dispensed through a nozzle directed toward the backside edge of the wafer, in which case it curls up around to the top of the wafer to dissolve the edge bead, or the solvent may be dispensed directly onto the top edge of the wafer. In either case, the process allows solvent and dissolved photoresist to be splashed about and often leaves a jagged edge profile on the photoresist or other coating material.

SUMMARY OF THE INVENTION

Accordingly, it is one object of the invention generally to increase the effectiveness of conventional edge bead removal systems. It is another object to control solvent and particle splashing during the process of removing the edge bead from the coating material. It is a further object of the invention to improve the edge profile of the coating material. These and other objects and advantages may be achieved in general by a method for dispensing a chemical, such as an edge bead removal solvent, onto a semiconductor wafer. The method comprises the steps of dispensing the chemical selectively onto the wafer and applying a suction to the area immediately surrounding the location at which the chemical is dispensed onto the wafer. Preferably, the suction is applied substantially simultaneously with the dispensing of the chemical.

One specific version of the invention provides an edge bead removal system wherein suction is applied to the area immediately surrounding the solvent dispensing nozzle to remove dissolved coating material and excess solvent from the wafer. In one aspect of this system, an apparatus for removing the edge bead includes a mechanism for dispensing a solvent selectively onto the edge of the wafer, and a mechanism surrounding the dispensing mechanism for vacuuming excess solvent and dissolved coating material from the edge of the wafer. The edge bead removal apparatus preferably also includes mechanisms for spinning the semiconductor wafer and coating material on the spinning wafer. Another aspect of the system provides a method for removing an edge bead of a coating of material that has been spun onto the surface of a semiconductor wafer. The method includes the steps of dispensing a solvent selectively onto the edge of the wafer to dissolve the coating material at the extreme edge of the wafer, and applying a suction to vacuum excess solvent and dissolved coating material from the wafer. Preferably, the suction is applied to the area immediately surrounding the location at which the solvent is dispensed onto the wafer simultaneously with the dispensing of the solvent.

DETAILED DESCRIPTION OF THE INVENTION

Figure 1:
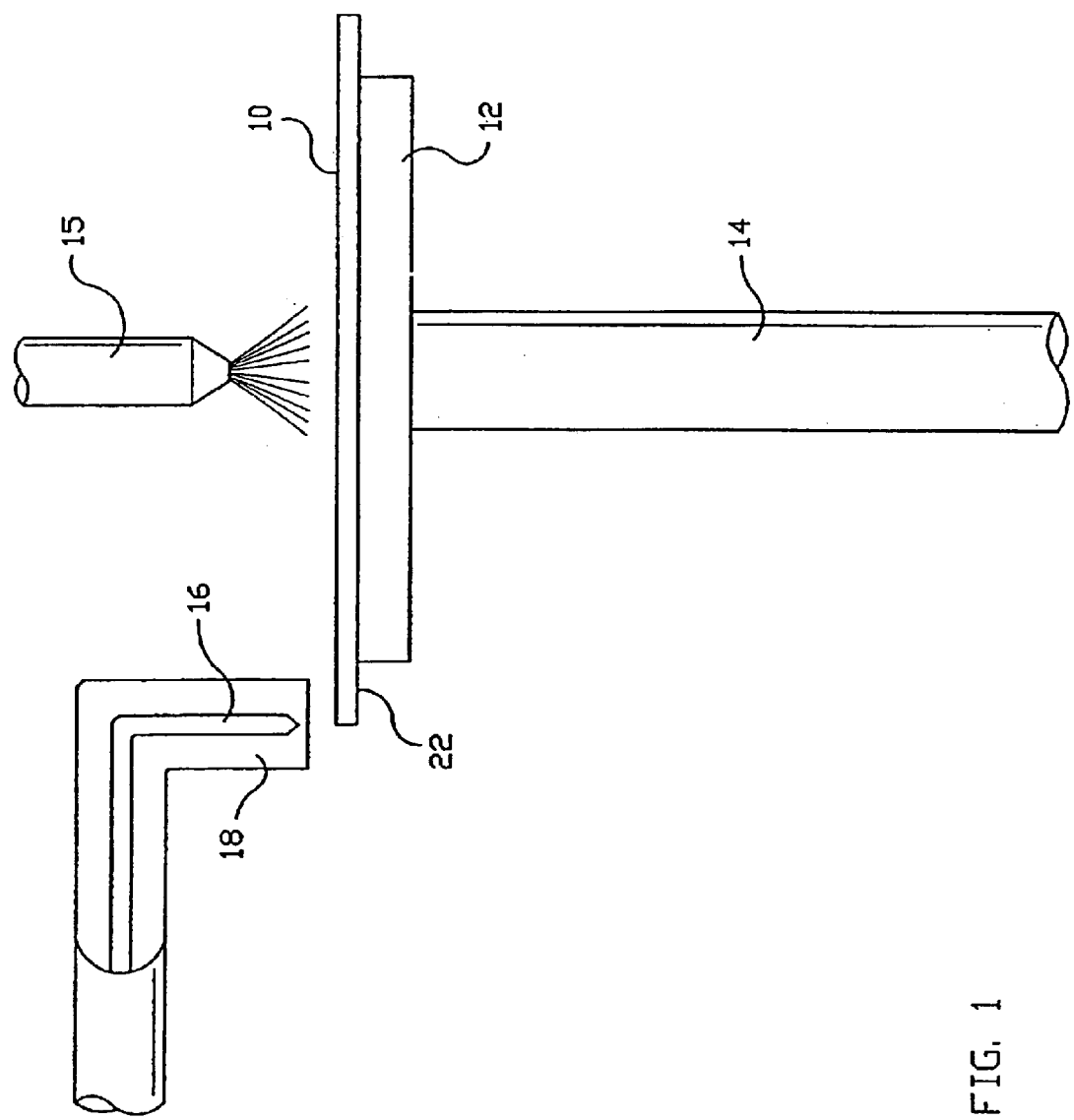
FIG. 1 is a partial side view of a spin coating device having the surrounding suction of the present invention wherein the edge bead removal solvent is dispensed onto the top of the wafer.

Referring to FIG. 1, wafer 10 is positioned on spin chuck 12. Spin chuck 12 is mounted on axle 14. Axle 14 is operatively coupled to a drive mechanism, such as an electric motor (not shown). The diameter of spin chuck 12 is less than the diameter of wafer 10 so that wafer 10 extends beyond the edge of spin chuck 12, a first nozzle 15 for dispensing coating material onto wafer 10 is positioned above and, typically, at the center of wafer 10. A second nozzle 16 for dispensing solvent to dissolve the edge bead is disposed above the edge of wafer 10. Solvent dispensing nozzle 16 is surrounded by vacuum port 18. Vacuum port 18 is operatively coupled to a source of negative pressure, such as a vacuum pump (not shown).

In operation, a suction is applied to the wafer 10 to hold it in place on spin chuck 12. Spin chuck 12 is rotated to spin wafer 10 as a solution of coating material, such as photoresist, is applied through first nozzle 15. Although photoresist is used herein as one illustrative coating, the invention is applicable to any soluble coating. The coating material is distributed across the top surface of wafer 10 largely due to centrifugal forces created by the spinning wafer. Excess coating material tends to collect at and form a bead along the edge 22 of wafer 10. To remove the edge bead, a solvent is sprayed through nozzle 16 onto the edge 22 of wafer 10 to dissolve the coating material at the extreme edge of the wafer. At the same time, the dissolved coating material and excess solvent is suctioned away from wafer 10 through vacuum port 18. Preferably, vacuum port 18 surrounds nozzle 16 and a suction is thereby applied to the area immediately surrounding nozzle 16, as shown in FIG. 1. Also, vacuum port 18 preferably moves with nozzle 16 as it is extended and retracted into position over wafer 10. This "surround vacuum" controls solvent and particle splashing during the process of removing the edge bead from the coating material. In addition, it is believed the surround vacuum improves the edge profile of the coating material.

Figure 2:
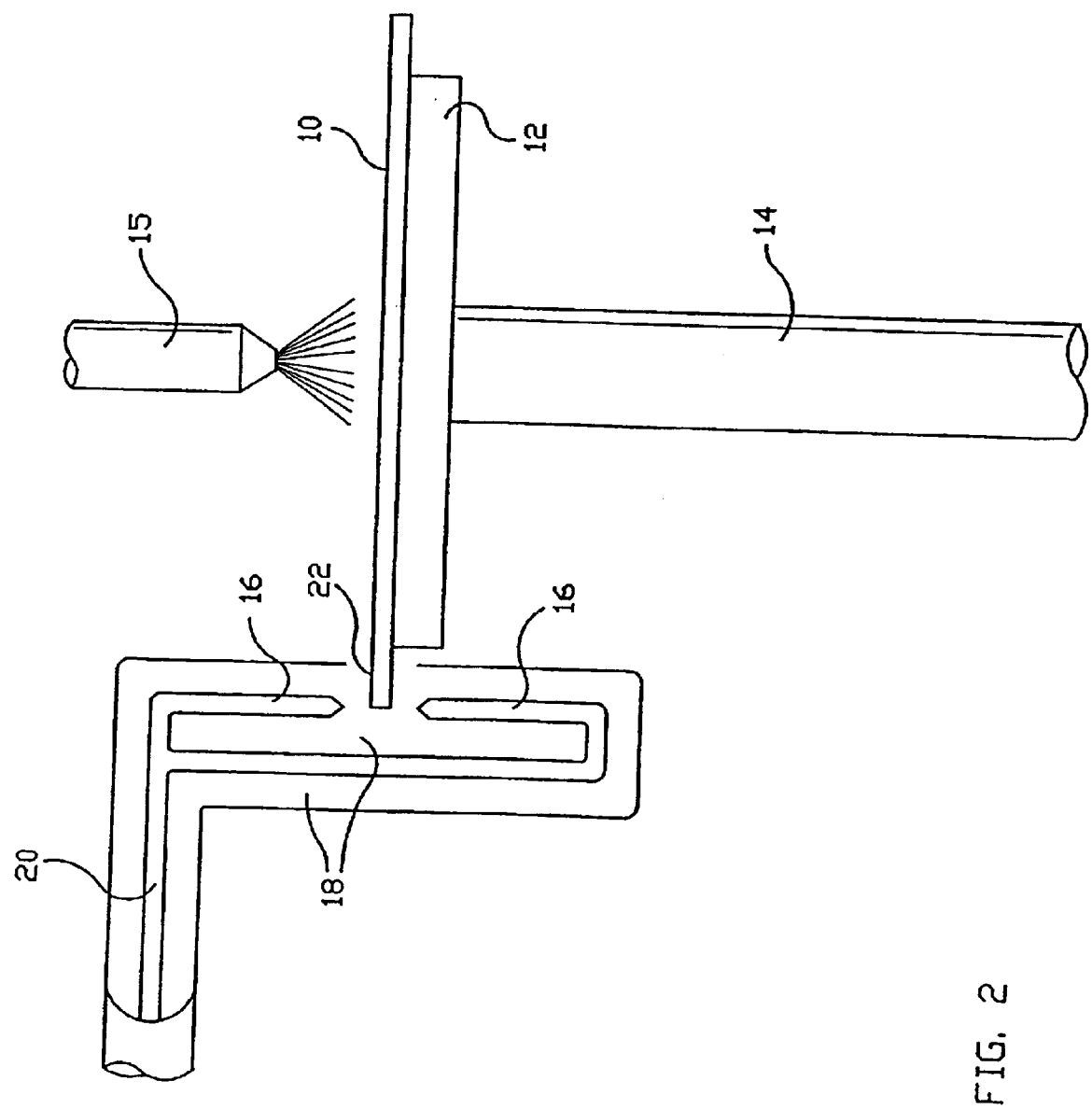
FIG. 2 is a partial side view of a spin coating device having the surrounding suction of the present invention wherein the edge bead removal solvent is dispensed onto both the top and bottom of the wafer.

FIG. 2 illustrates a second embodiment of the invention wherein the solvent is applied to both the top and bottom surfaces of wafer 10. Wafer 10 is positioned on spin chuck 12 which is rotated on axle 14. An edge bead removal solvent is supplied through tubes 20 to dispensing nozzles 16. The solvent is sprayed through nozzles 16 onto the edge 22 of wafer 10 and, at the same time, the dissolved coating material and excess solvent is suctioned away through vacuum ports 18.

Conventional spin coating machines, such as a SVG Coat Track or TEL Mark 8, can be adapted for use in accordance with the invention as described herein. With the exception of the vacuum ports, the above described components are conventional and well known to those skilled in the art. There has been shown and described an edge bead removal system wherein a suction is applied to the area surrounding the solvent dispensing nozzle to control splashing and improve the edge profile of the coating material. The particular embodiments shown and described herein are for purposes of example and should not be construed to limit the invention as set forth in the appended claims.

What is claimed is:

1. A removal system for a workpiece having an overlying material, comprising:
   a nozzle having an extended position and a retracted position, wherein said nozzle is disposed toward said workpiece and configured to dispense a chemical toward said workpiece while in said extended position; and
   a suction applicator commensurately movable with said nozzle and defining a port around said nozzle, wherein said suction applicator is configured to withdraw said chemical and said material at a distance from said workpiece.

2. The removal system in claim 1, wherein said nozzle is further configured to dispense said chemical toward said material.

3. The removal system in claim 1, wherein said nozzle is further configured to dispense said chemical toward a portion of said workpiece interposed between said nozzle and said material.

* * * * *

UNITED STATES PATENT AND TRADEMARK OFFICE
CERTIFICATE OF CORRECTION

PATENT NO.   : 6,793,764 B1
DATED        : September 21, 2004
INVENTOR(S)  : Trung T. Doan It is certified that error appears in the above-identified patent and that said Letters Patent is hereby corrected as shown below:

<u>Column 2,</u>
Line 41, replace the comma "," with a period -- . --;
Line 41, replace the word "a" with a capitalized -- A --.

Signed and Sealed this

Eighth Day of February, 2005

JON W. DUDAS
*Director of the United States Patent and Trademark Office*